US005126510A

United States Patent [19]

Bauer et al.

[11] Patent Number: 5,126,510

[45] Date of Patent: Jun. 30, 1992

[54] THERMAL PROTECTOR HOUSING FOR LIGHTING FIXTURES

[75] Inventors: Claude J. Bauer, Hendersonville, Tenn.; Kenneth H. Walterick, Blandon, Pa.

[73] Assignee: Challenger Electrical Materials, Inc., Malvern, Pa.

[21] Appl. No.: 628,136

[22] Filed: Dec. 14, 1990

[51] Int. Cl.[5] .............................................. H05K 5/00

[52] U.S. Cl. .................................... 174/52.1; 174/50; 337/112; 337/380; 362/362; 361/380

[58] Field of Search .................. 174/50, 52.1; 337/34, 337/112, 113, 380, 381; 362/362, 368; 361/380, 390, 392, 422, 423

[56] References Cited

U.S. PATENT DOCUMENTS 3,253,084 5/1966 Taylor .
3,272,908 9/1966 Beecher .
3,335,387 8/1967 Mueller .
3,430,177 2/1969 Audette .
3,430,185 2/1969 Sitzler et al. .
4,297,668 10/1981 Place .
4,314,223 2/1982 Kristofek .
4,446,451 5/1984 Boulanger .
4,583,640 4/1986 Gillam .
4,635,172 1/1987 Steinke .
4,710,743 12/1987 Givler .
4,835,667 5/1989 Wolfe .
4,861,943 8/1989 Yarmark .

*Primary Examiner*—Leo P. Picard
*Assistant Examiner*—Bot Lee Ledynh
*Attorney, Agent, or Firm*—M. J. Moran

[57] ABSTRACT

A thermal protector housing, for use in mounting an electrical thermal protector on a surface of a device to be protected against undue temperature rise, comprises a housing body of insulating material with an open end for receiving a thermal protector to be housed in it, a stop within a body limiting the distance the protector can be inserted and a securing member for securing a thermal protector between the open end and the stop, which securing member comprises a flexible finger portion of an exterior surface of the housing body.

7 Claims, 5 Drawing Sheets

FIG. 1
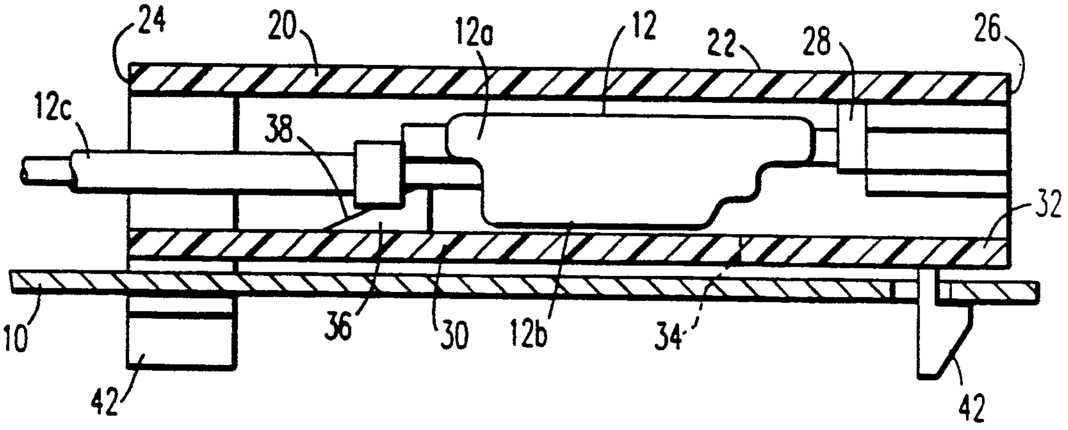
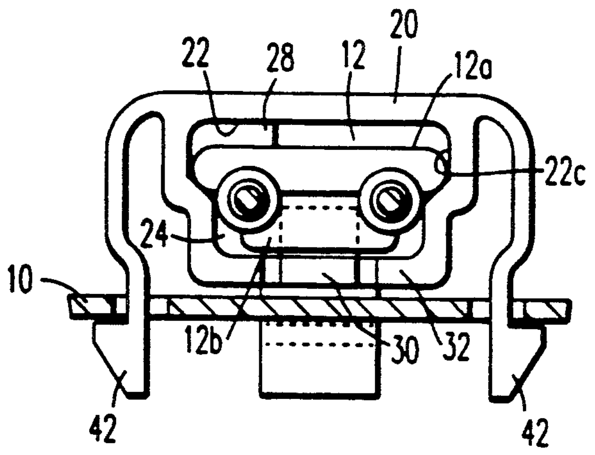
FIG. 2

THERMAL PROTECTOR HOUSING FOR LIGHTING FIXTURES

BACKGROUND AND SUMMARY OF THE INVENTION

This invention relates to a housing for a thermal protector device that protects against overheating of a lighting fixture, or the like.

Lighting manufacturers install a commercially available thermal sensor (also called a thermal switch or thermal protector) which will interrupt power to a fixture when temperatures exceed a certain level. The thermal protector is electrically connected with the power circuit for the lighting fixture and, since it is live during operation, must be insulated from contact with other live parts of the lighting fixture. Current designs of a thermal protector housing require labor intensive means of installation and sometimes do not provide a secure means of holding the thermal protector in place. In addition, replacement of a damaged housing often causes the protector to be destroyed.

Reference is made to Steinke U.S. Pat. No. 4,635,172, Jan. 6, 1987, and Wolfe U.S. Pat. No. 4,835,667, May 30, 1989, for examples of the use of thermal protector devices with lighting fixtures. Reference is also made to Yarmark U.S. Pat. No. 4,861,943, Aug. 29, 1989 which also relates to that subject and discloses a particular form of thermal protector housing with some features in common with the present invention but as to which the present invention is an alternative and an improvement.

In Yarmark, a thermal protector housing includes a body having openings at both ends with a trench therein for guiding the thermal protector through the body and with a resilient tab extending from the interior top surface of the body and stops disposed within and near the front of the body for securing the protector to the body. An arm and a pair of legs extend from the bottom of the body to serve as fasteners to clip the body to a flat plate of the lighting fixture which has apertures receiving the arm and pair of legs. While generally effective for securing a thermal protector, such a device does not allow protector replacement without destroying the integrity of the housing.

The descriptions of the foregoing patents are incorporated herein by reference.

By the present invention, a plastic enclosure houses a thermal protector and provides a means of securing a thermal protector to a master enclosure or an element of a lighting fixture. The housing incorporates a novel latching mechanism to secure the thermal protector inside it that not only affords maximum security but also allows removal of the protector and replacement without damage to the housing. The housing is a molded plastic element generally in the form of a hollow sleeve or flattened tube into which the thermal protector can be readily slid. During the sliding of the thermal protector into the sleeve, it engages a camming surface of a spring finger that comprises part of the exterior of the housing. The engagement of the camming surface of the spring finger causes it to move out of the way so the protector can slide past it and is locked in place once past the projecting portion of the camming surface. The spring finger provides positive locking of the protector unit in place. It also allows the protector unit to be removed by merely lifting the spring finger away from the interior of the housing so that the protector unit can be withdrawn without being blocked by the projection on the spring finger.

The housing further has projections or tabs for interlocking with a surface of a lighting fixture. In the preferred forms, the tabs are configured for positive locking with less risk of breakage than in prior designs.

The described spring finger may, in general, be on any exterior surface of the housing sleeve. Providing the spring finger on the upper surface away from the fixture surface allows extra facility in removal of a thermal protector when desired after installation. However, by locating the spring finger on the underside of the surface more positive securement of the protector is provided.

As an option, with the spring finger on the underside of the housing adjacent the surface of the lighting fixture, the tabs can be made just long enough so the housing can be lifted from the surface sufficiently to move the spring finger and release a protector.

This form of the invention that allows replacement of a thermal sensor when the housing is in place on the fixture may be particularly useful when it is desirable to be able to change a thermal sensor to one of a different rating.

It is therefore the case that very good securement of the thermal protector is achieved without depending on a resilient tab protruding downwardly from the top interior wall of the housing and, also, means are provided for easy removal of a thermal protector when desired, such as if one of the tabs breaks upon installation.

In most respects, it is desirable and advantageous merely to have the housing as described without the option of allowing replacement of a thermal sensor once the housing is installed in a fixture. The spring finger on the bottom surface of the housing allows secure retention of the thermal sensor. As such housings are made and installed, they are susceptible to having one or more of the tabs broken off in their installation procedure. In the housings of former design, the thermal sensor is located now in the defective housing which must be withdrawn and discarded. According to the present invention, the housing that is damaged in installation can simply be withdrawn from the fixture and the spring finger lifted to enable removal of the thermal sensor so that it need not be discarded. Without this feature, the housing that has a broken tab would have to be physically cut in order to remove the sensor and extra care would have to be taken not to damage the sensor in that process.

Further details with respect to features achieving objects and advantages of the present invention will be found in the ensuing description.

BRIEF DESCRIPTION OF THE DRAWINGS

FIG. 1 is a longitudinal cross-sectional view of a thermal protector in a housing installed on a surface of a device to be protected by the thermal protector, in accordance with one embodiment of the present invention;

FIG. 2 is an end view of the installed protector and housing of FIG. 1;

DESCRIPTION OF THE PREFERRED EMBODIMENTS

Figure 3:
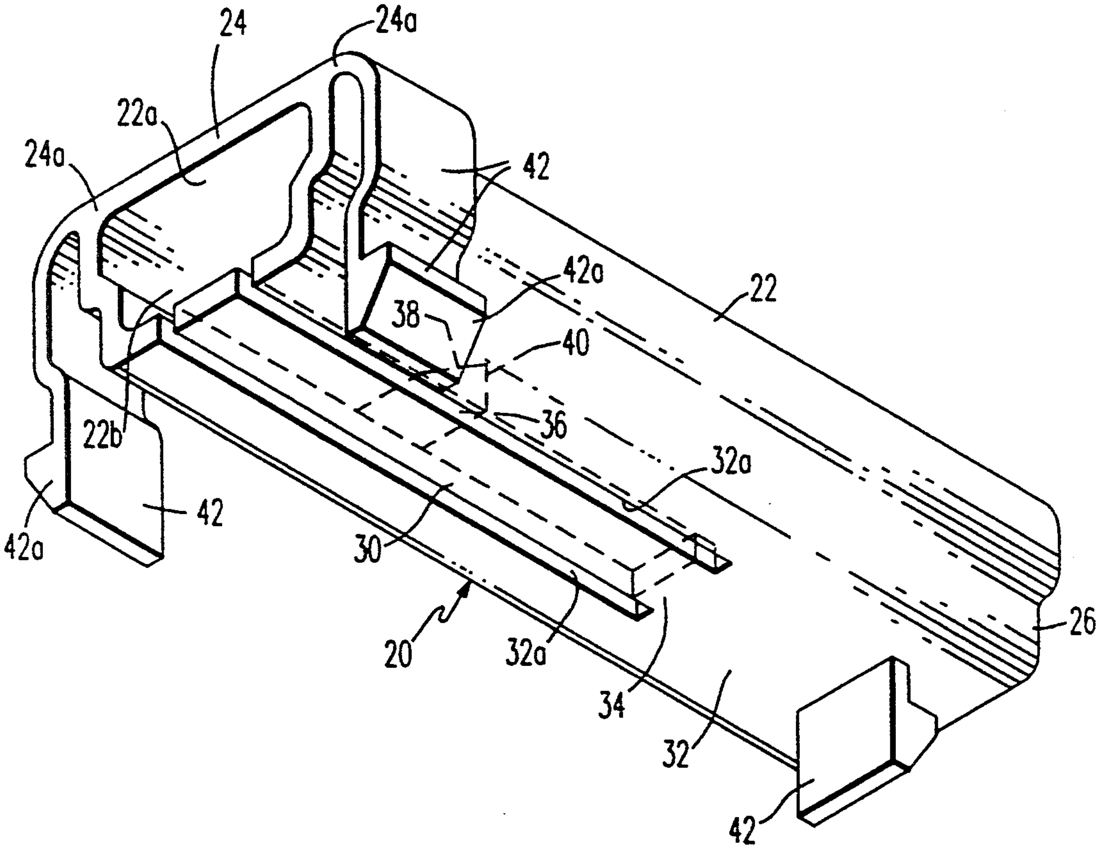
FIG. 3 is an isometric view of the thermal protector housing of FIG. 1.

Referring to FIGS. 1 and 2, a metal surface 10 is shown that represents part of an electrical device to be protected against undue temperature rise by a thermal protector 12 that opens a circuit upon sensing a given temperature, Typically, certain recessed lighting fixtures for incandescent lamps utilize such protectors. The object is to get the thermal protector into close thermal proximity to the heat generating elements of the device, such as the incandescent lamp and to permit convenient mounting of the protector in the desired position.

The thermal protector 12 itself is a widely known and used element that typically has a configuration as illustrated with a generally flat rectangular portion 12*a* on which is located a central portion 12*b* of similar rectangular configuration but somewhat smaller in area. The leads 12*c* of the device extend away from the main portion of the protector in the same direction in the example of FIG. 1. The device 12 is drawn as an outline of a GTE Metal CD series thermal protector, which is a commonly used device. Other such protectors have similar dimensions which allows use of one housing design for devices from different manufacturers, some have leads extending in opposite directions.

The thermal protector 12 is contained within a housing 20 that includes a hollow housing body 22 of insulating material with an open end 24 for receiving the thermal protector 12 housed therein. The opposite end of body 22 is also open in this example. The housing body includes in its interior a stop 28 limiting the distance that the thermal protector 12 can be inserted and it also includes means for securing a thermal protector 12 between the open end 24 and the stop 28. The means for securing the thermal protector in accordance with this example comprises a flexible finger portion 30 of the bottom surface 32 of the housing body 22 that is joined with the surface 32 at an intermediate attachment location 34. Finger portion 30 has a projection 36 with a camming surface 38 facing the open end 24 and a perpendicular surface 40 facing the other end 26. This allows a protector 12 to be inserted by pushing it within the open end 24 of the body over the camming surface 389 by the flexing of the finger portion 30. The device 12 is locked in place by projection surface 40 acting as a shoulder once it is past the camming surface 38 and the finger portion 36 returns to normal position. The embodiment of FIG. 1 also shows means for affixing the housing body to apertures in the surface 10 of the fixture to be protected which is a plurality of tabs 42.

As is further illustrated in FIG. 3, the housing 20 including housing body 22 with the finger portion 36 in its bottom surface 32 and also including the attachment tabs 42 and the stop 28 for limiting the permitted travel of the thermal protector 12 are all parts of one integrally molded insulating member of a material such as Zytel material-types FR-50 or 105-F, or another nylon type material, for example.

The interior of the housing body 22 may be configured as desired to conform to that of the thermal protector 12 itself. The principal objectives are however achieved by making sure the thermal protector 12 is confined sufficiently between the shoulder surface 40 of the projection 36 on the flexible finger 30 and the stop 28.

While an open end 24 is referred to as the means for placing the protector 12 within the housing 20, it is generally the case that each end 24 and 26 of the housing will be open to some degree to facilitate air flow over the protector.

While not limiting, the housing 20 of FIGS. 1-3 as well as other figures all provide for the protector 12 to be located with its wider dimensioned portion 12*a* in the upper volume 22*a* away from surface 10 and the smaller dimensioned portion 12*b* located in the lower volume 22*b* next to surface 10. Volumes 22*a* and 22*b* are roughly proportioned in size to portions 12*a* and 12*b* of the protector. Also, as configured in this example, the protector portion 12*a* rests on longitudinal shoulders 22*c* of the hosing body; the protector portion 12*b* is slightly up from the bottom surface 32.

The preceding paragraph refers to the situation when the housing 20 is mounted with the surface 10 vertically beneath it. It is also suitable for the surface 10 to be above, or beside, the housing 20. In the description herein, the "bottom" surface 32 of the housing is the housing surface adjacent the fixture surface 10 regards of their orientation in relation to the earth's surface.

Furthermore, as to orientation terms used herein, the open end 24 for protector insertion is considered the "front" end of the housing.

In the embodiment of FIGS. 1, 2 and 3, the tabs 42 comprise a pair of leg portions extending laterally from near the end 24 of the housing body 22. An additional tab 42 extends from the bottom of the housing body at the far end. These three tabs 42 fit within apertures of the device surface generally by locating the far end tab in its aperture, as in FIG. 1, and then forcing the front tabs into their respective apertures until the tab projections 42*a* with the surface that is tapered in the manner of a camming surface, passes through the aperture and the tabs spring out to grip the underside of the device surface.

Figure 4:
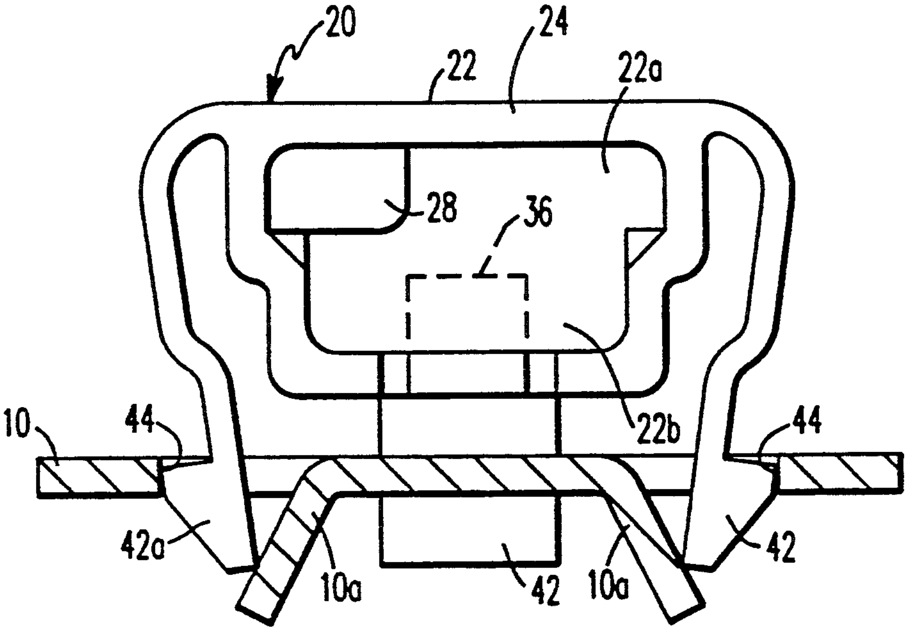
FIGS. 4 and 5 are end views of the thermal protector housing of FIG. 3 showing in FIG. 4 a view during the installation of the housing into a device surface and in FIG. 5 the housing as installed in the device surface.
Figure 5:
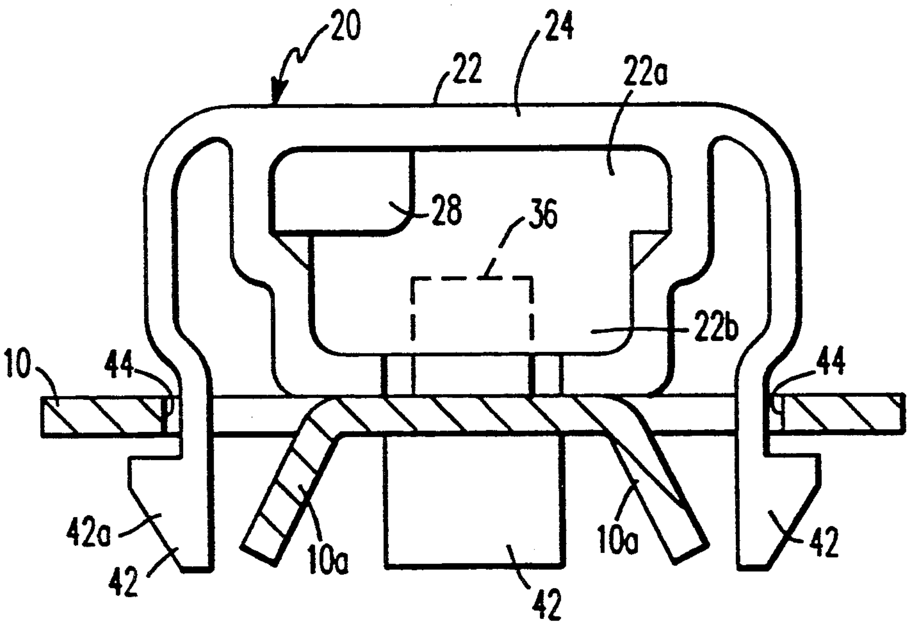

In FIG. 4 is shown the device surface 10 in which apertures 44 for the front tabs have been formed by stamping the surface and deforming the material thereof to provide the metal tongs 10*a* as shown. In FIG. 4, the tabs 42 are being inserted with the projections 42*a* at the position where they are engaged against the edge of the apertures 44 in the surface 10. FIG. 5 shows the position after they have been fully inserted and the legs of the tabs 42 have now relaxed to the position as shown which securely locks the housing in place against the surface.

Figure 8:
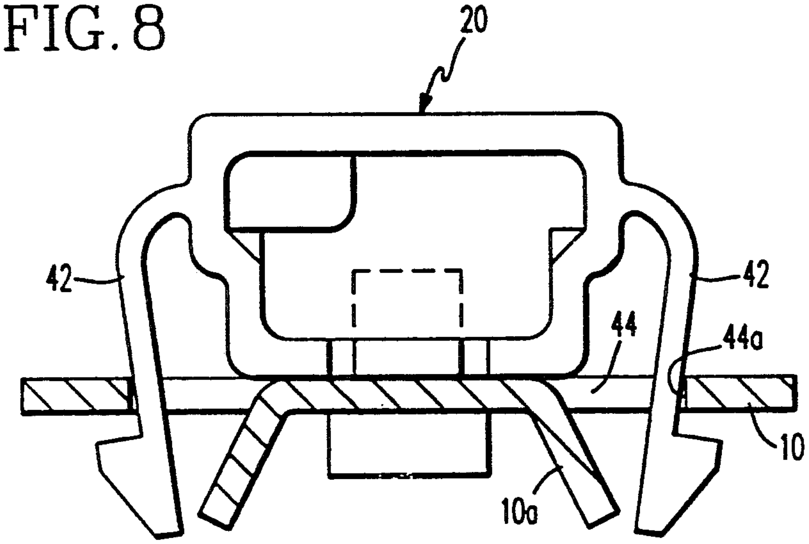
FIG. 8 is an end view of a thermal protector housing substantially in accordance with FIG. 6 showing its installation in a surface of a device in a manner that is somewhat different than that of FIG. 5.

In another form of the invention as shown in FIG. 8, tabs like or similar to those of FIG. 5 or any other version of the housing may be arranged with the dimensions of the housing, tabs, and apertures in the surface selected so that when inserted the tabs 42 are spring biased against the edge 44*a* of the surface apertures 44. This provides a degree of extra security of the mounting.

Figure 6:
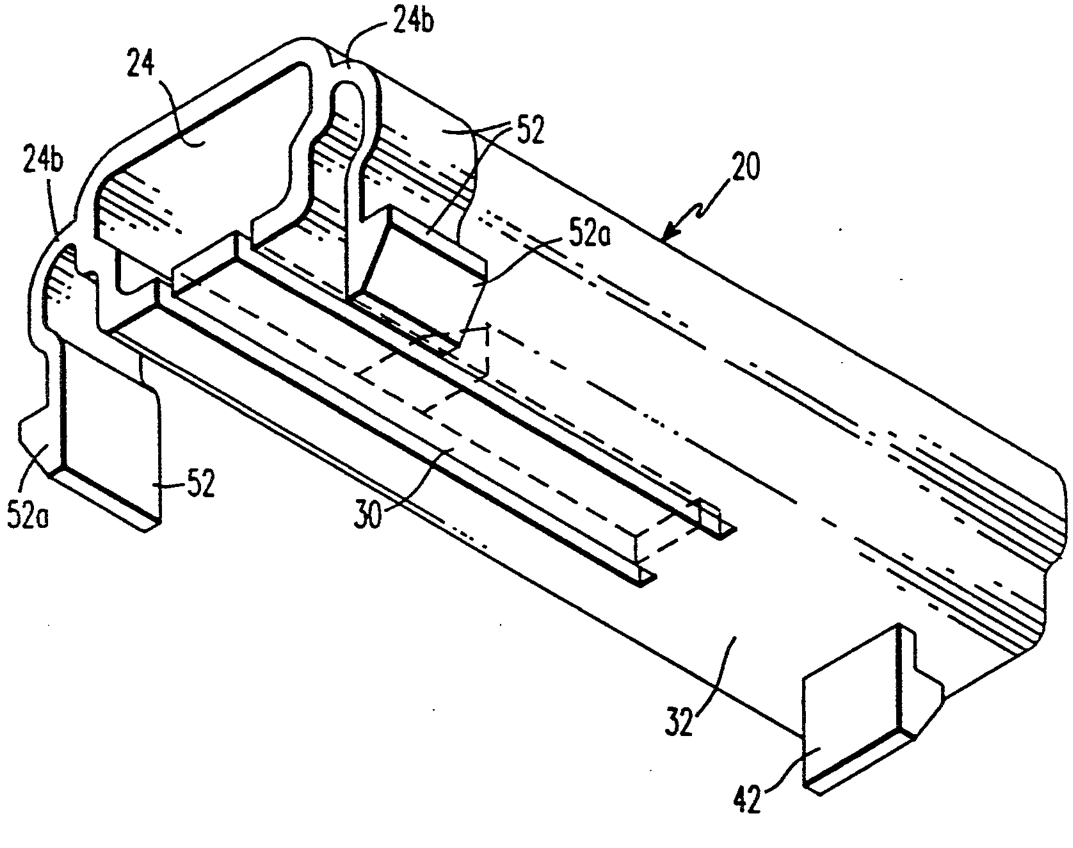
FIGS. 6 and 7 are isometric views of thermal protector housings in accordance with alternative embodiments of the invention.
Figure 7:
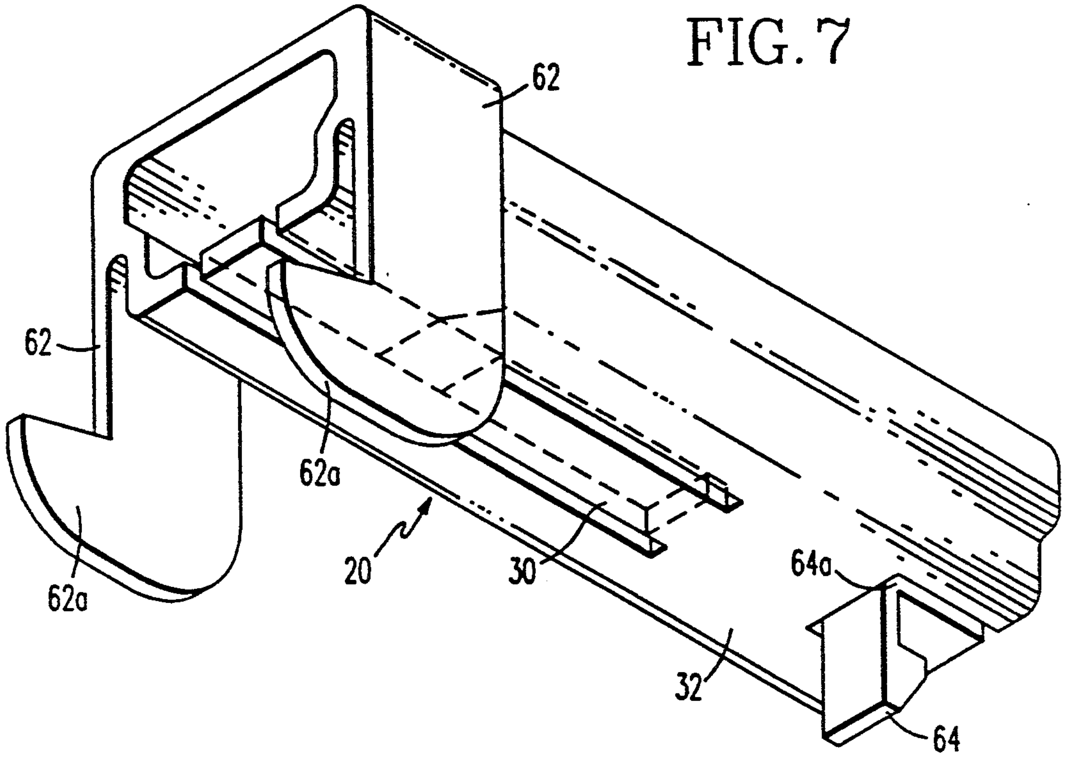

FIGS. 6 and 7 show substantially similar housings 20 which may have identical interiors and identical spring finger portions 30 but with different tab means for securing them into apertures of a fixture surface 10.

FIG. 6 differs from FIG. 3 in the configuration of the front tabs 52 as compared to those of FIG. 3. In FIG. 3, front tabs 42 are joined to housing body 22 at the upper side of the open end 24 at locations 24*a*. In contrast, in FIG. 6, the joint 24*b* of tabs 52 to body 22 is spaced from the top of the body but still closer to the top than to the bottom surface 32. As compared to former designs, such as in the above-mentioned U.S. Pat. No. 4,861,943, the extra length of the front tabs 42 (FIG. 3) and 52 (FIG. 6) from their joints to the body to the locking projections 42*a* and 52*a*, respectively, provide extra springiness that allows easier installation in apertures of a surface 10 with less risk of tab breakage.

In FIG. 7, the front tabs 62 have forward extending hook portions 62*a* at their extremities. These slide into apertures in the fixture surface after which thereat tab 64 is sprung in place in its aperture for which purpose tab 64 is joined to the housing bottom surface at a flexible joint 64*a*. This arrangement also limits risk of tab breakage during the installation.

Major advantages of the present invention as compared to those formerly used results from the inclusion of the flexible finger portion 30 in the housing 20.

In instances in the past in which an insulating housing such as that of above-mentioned U.S. Pat. No. 4,861,943 is used, the tabs at the front end of the housing are subject to forces that may break them off during the insertion of the housing into the fixture surface. For overall facility of assembly, the thermal protector is inserted into the housing prior to the housing being installed on the fixture surface. In the event that one of the tabs is broken off during the insertion process, it has been necessary to withdraw the housing from the surface and then either discard the housing and the thermal protector that it contains or to cut open the housing so that the thermal protector can be removed. Neither of these operations is required in accordance with the present invention. Instead, the housing can be removed from the fixture surface and then the spring finger 30 simply lifted away from the housing body 20 to allow the projection 36 to be removed as an obstruction for the protector 12 so that it can be withdrawn through the open end 24 without requiring the housing body to be severed. This can be a substantial benefit in the course of manufacturing large numbers of devices such as recessed lighting fixtures and is valuable in the context of the present invention, although as described above the tabs are less susceptible to breakage.

The embodiments of the invention all include the flexible finger portion 30 in the bottom surface of the housing body 20 which is preferred in order to provide maximum security to the installation. The flexible finger 30 in that position is not subject to any inadvertent movement that would allow the thermal protector 12 to be dislodged. In alternative forms of the invention, it is possible, however, for the flexible finger portion 30 to be located in, for example, the upper surface of the housing. This would allow the opportunity to replace thermal protectors within a housing once it is installed in a device surface. This possibility exists because of an occasional need for the ability to change a thermal protector to a different rating. In another form of the invention, the flexible finger portion 30 may occur in the bottom surface 32 of the housing body to provide a high degree of security for the protector but with enough slack provided by the dimensions of the tabs so that the housing body can be manually lifted without unlocking the tabs from the device surface and the flexible finger can be depressed to allow removal of a thermal protector that it is desired to replace. Of course, the designs without that feature do allow the housing to be detached from the fixture surface to permit protector replacement.

All of the various examples referred to include the finger 30 which is joined at 34 to bottom surface 32 but with cuts on slots 32*a* between the longitudinal edges of the finger 30 and the adjacent surface 32.

The foregoing examples represent presently preferred embodiments of the invention while being subject to other modifications and variations in accordance with skill in the art.

We claim:

1. A thermal protector housing, for use in mounting an electrical thermal protector on a surface of a device to be protected against undue temperature rise, comprising:

a housing body of insulating material with an open end for receiving a thermal protector to be housed therein, a stop within the body limiting the distance the protector can be inserted, and means for securing a thermal protector between the open end and the stop;

the means for securing a thermal protector comprising a flexible, finger portion of an exterior surface of the housing body that is integral with the surface at an intermediate location of the body and has a projection with a camming surface facing the open end for allowing a protector to be inserted by pushing within the open end of the body, forcing it past the camming surface by flexing the finger portion and locking it in place by the projection once it is past the projection and the finger portion returns to normal position;

tab means for affixing the housing body to apertures in the surface of the device to be protected.

2. A thermal protector housing in accordance with claim 1 wherein:

the flexible finger portion is on the same side of the housing body as is the tab means.

3. In combination, a thermal protector housed in a thermal protector housing in accordance with claim 1.

4. In combination, a thermal protector housed in a thermal protector housing in accordance with claim 2.

5. A thermal protector and housing in accordance with claim 3 installed on a surface of a device to be protected by the tab means of the housing extending into locking engagement with apertures in the surface of the device.

6. A thermal protector and housing in accordance with claim 4 installed on a surface of a device to be protected by the tab means of the housing extending into locking engagement with apertures in the surface of the device.

7. A thermal protector housing in accordance with claim 1 wherein:

the flexible finger portion permits removal of a thermal protector contained therein by manual lifting of the finger portion so the projection is removed as an obstruction and the protector can be withdrawn through the open end without requiring the housing body to be severed.

* * * * *